United States Patent [19]
Carlson

[11] 3,855,550
[45] Dec. 17, 1974

[54] TRANSISTOR OSCILLATOR WITH DIODE IN FEEDBACK CIRCUIT PROVIDING AMPLITUDE STABILIZATION

[75] Inventor: David John Carlson, Indianapolis, Ind.

[73] Assignee: RCA Corporation, New York, N.Y.

[22] Filed: Aug. 24, 1973

[21] Appl. No.: 391,417

[52] U.S. Cl. .......... 331/109, 331/117 D, 331/177 V
[51] Int. Cl. .......... H03b 3/02, H03b 5/12
[58] Field of Search .......... 331/109, 117 R, 117 D, 331/183, 177 V

[56] References Cited

UNITED STATES PATENTS

| | | | |
|---|---|---|---|
| 3,117,288 | 1/1964 | Modiano | 331/109 |
| 3,723,906 | 3/1973 | Pedersen | 331/109 X |

*Primary Examiner*—John Kominski
*Assistant Examiner*—Siegfried H. Grimm
*Attorney, Agent, or Firm*—Eugene M. Whitacre; Lawrence M. Lunn

[57] ABSTRACT

A voltage-dependent capacitor tuned oscillator employs a diode as a coupling element between an amplifying device and a resonant circuit to provide a feedback signal to the amplifying device required to sustain oscillations. The diode further provides charging current for a capacitor in the resonant circuit when a first polarity portion of the oscillations increase above a predetermined level. The charge on the capacitor decreases the feedback level, thus stabilizing the level of oscillations in the resonant circuit for each frequency to which the oscillator is tuned.

12 Claims, 2 Drawing Figures

TRANSISTOR OSCILLATOR WITH DIODE IN FEEDBACK CIRCUIT PROVIDING AMPLITUDE STABILIZATION

BACKGROUND OF THE INVENTION

The invention relates to oscillators and more particularly to oscillators of the type having a resonant circuit comprising a voltage-dependent capacitor for tuning the oscillator.

In oscillators employing voltage-dependent capacitors for tuning the frequency determining resonant circuit, an increase in the amplitude or level of the oscillator signal across the voltage-dependent capacitor results in an increase in the capacitance of the voltage-dependent capacitor. As the capacitance increases, there is a corresponding decrease in the resonant frequency of the resonant circuit and thereby a decrease in the frequency of the oscillator output signal.

Oscillator signal level may change as a result of component temperature change, frequency of tuning, and/or component parameter change.

In prior art oscillators such as found in U.S. Pat. No. 3,723,906 (Pederson), a voltage-dependent capacitor is used to alter the feedback level to an amplifying device in response to a change of frequency of tuning. However, in the arrangement disclosed therein, no compensation is provided for signal level change as a result of component temperature change and/or component parameter change.

SUMMARY OF THE INVENTION

According to the present invention, an oscillator comprises a resonant circuit including at least an inductance element and a capacitance element; an amplifying device having first, second, and third electrodes; biasing means coupled between the second and third electrodes for conditioning the amplifying device for conduction; means for coupling the resonant circuit to the first electrode; and feedback means. The feedback means includes a rectifier for coupling the resonant circuit to the third electrode of the amplifying device to sustain oscillations in the resonant circuit. The rectifier further provides for charging of the capacitance element and reducing of the amplitude of oscillations fed back to the third electrode upon an increase of a first polarity portion of the oscillations beyond a predetermined level.

Figure 1:
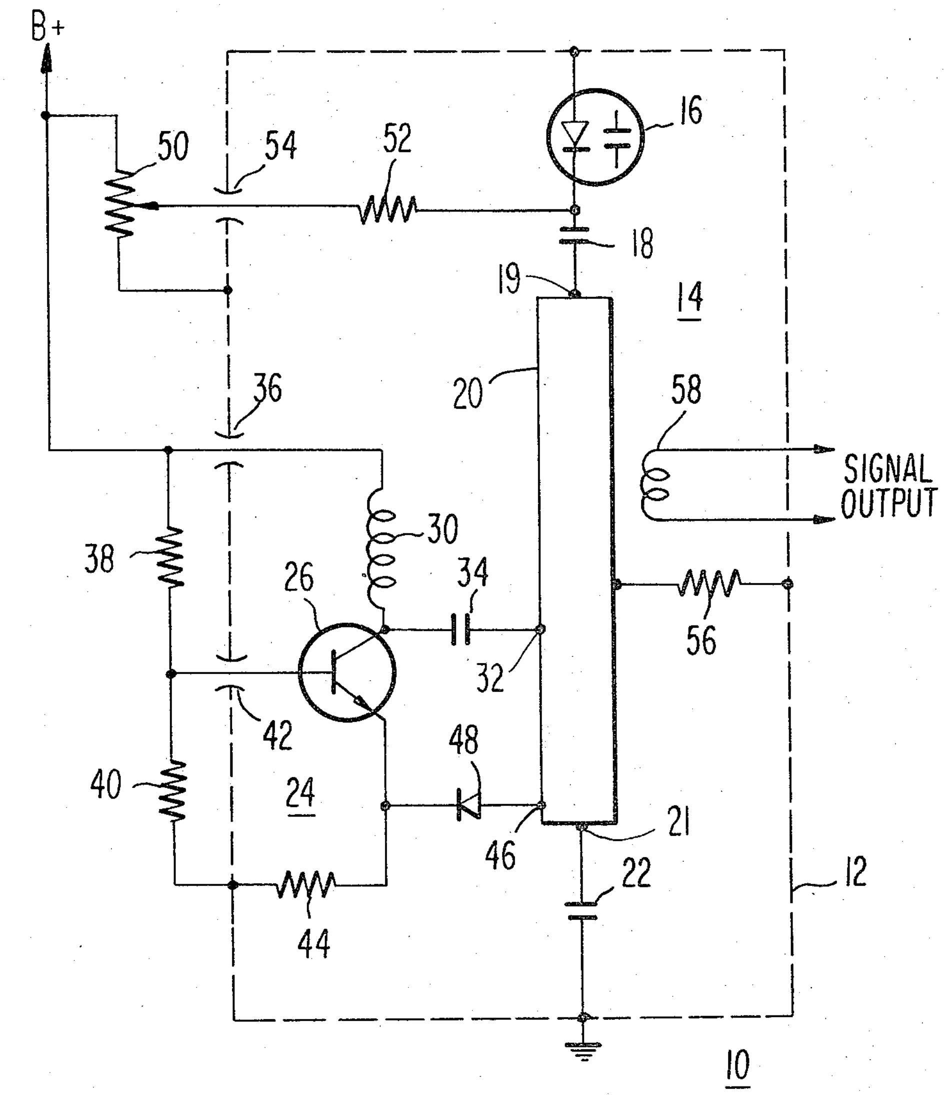
Figure 2:
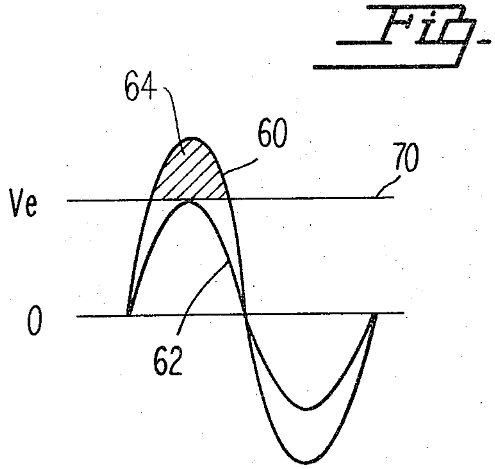

A more complete understanding of the invention may be obtained from the following detailed description of a specific embodiment thereof, when taken in conjunction with the drawings, in which:

FIG. 1 is a schematic of an oscillator suitable for use, for example, as the local oscillator in a UHF television tuner; and FIG. 2 is a graphic representation of two signal levels relative to a predetermined level, which signals are obtained in the circuit of FIG. 1.

Referring now to FIG. 1, an oscillator 10 has a shielding enclosure 12 which is coupled to a reference potential (ground). A resonant circuit 14 within the shielding enclosure 12 determines the frequency of oscillation. The resonant circuit 14 includes a voltage-dependent capacitor 16 having an anode coupled to the shielding enclosure and a cathode coupled via a capacitor 18 to a first terminal 19 of a transmission line inductor 20. A second terminal 21 of inductor 20 is coupled to the shielding enclosure 12 via a charge-storage capacitor 22. The components of the resonant circuit 14 coupled together in this series manner provide for a selection of frequencies to which the oscillator 10 can be tuned. In the case of a UHF tuner, for example, the oscillator is tunable over a range of frequencies from 517 MHz to 931 MHz.

A tuning voltage is derived from a potentiometer 50 having a resistive element coupled between the B+ terminal and the shielding enclosure 12. A wiper terminal in contact with the resistive element supplies a variable tuning voltage and is coupled via a signal decoupling resistor 52 to the cathode of voltage-dependent capacitor 16 and thereby provides for control of the capacity of the voltage-dependent capacitor and thus determines the resonant frequency of resonant circuit 14. The wiper terminal of potentiometer 50 is also bypassed to the shielding enclosure at oscillator signal frequencies by means of bypass capacitor 54.

An amplifying circuit 24 provides for the addition of energy to the resonant circuit 14 to provide for sustained oscillation. The amplifying circuit 24 comprises an NPN transistor 26 having base, emitter and collector electrodes. The collector electrode is coupled to a source of operating voltage B+ via a radio frequency (RF) choke coil 30. The collector is also coupled to a first tap terminal 32 of the transmission line inductor 20 via a coupling capacitor 34. The source of operating potential B+ is bypassed to the shielding enclosure 12 at oscillator signal frequencies by means of a feedthrough capacitor 36, thus preventing high frequency signals from passing into or out of the shielding enclosure 12 via external connections to feedthrough capacitor 36.

A series combination of resistors 38 and 40 is coupled between the B+ terminal and the shielding enclosure 12. The common connection of resistors 38 and 40 is coupled to the base terminal of transistor 26 and provides a substantially fixed base bias voltage. The base terminal is also bypassed to the shielding enclosure at oscillator signal frequencies by means of feedthrough capacitor 42.

The emitter electrode of transistor 26 is coupled to the shielding enclosure 12 via emitter resistor 44 and to a second tap 46 of transmission line inductor 20 via a feedback diode 48. The feedback diode 48 has an anode and a cathode, the anode being coupled to the second tap terminal 46 and the cathode being coupled to the emitter electrode of transistor 26.

A bleeder resistor 56 is coupled between a third tap terminal 57 of transmission line inductor 20 and the shielding enclosure 12 and serves to discharge charge-storage capacitor 22 as will be explained subsequently.

Pickup coil 58 is magnetically coupled to transmission line inductor 20 and provides a means for supplying an oscillator signal to circuitry external to shielding enclosure 12.

Referring now to FIG. 2, sinusoidal curves 60 and 62, respectively, are shown having peak values greater than and equal to a predetermined voltage level 70. The area 64 represents that portion of curve 60 extending beyond the predetermined level 70.

In operation, the frequency of oscillation of the oscillator 10 is determined by adjusting the wiper terminal of potentiometer 50 to provide a voltage on the anode of the voltage-dependent capacitor 16 necessary to tune the resonant circuit 14 to that frequency.

Upon applying B+, a substantially fixed percentage of the B+ is applied to the base electrode of amplifying transistor 26. With the substantially fixed potential on the base electrode, the potential on the emitter electrode of transistor 26 is one $V_{BE}$ (approximately 0.6 volt) less than the base electrode potential.

Also, as the B+ is applied, the collector electrode voltage goes positive. As the voltage on the collector electrode goes positive, a positive going voltage change occurs at the first tap terminal 32. The voltage going positive at the first tap 32 induces a positive going signal at the second tap terminal 46.

The feedback diode 48 is reverse biased by the emitter voltage of transistor 26 and functions as a feedback capacitor and, in this particular function, is similar to that arrangement employed in oscillator circuits utilizing a conventional capacitor. Therefore, as the voltage at the second tap terminal 46 goes positive, a positive going voltage is coupled to the emitter electrode of transistor 26. The positive going voltage at the emitter electrode reduces the base-to-emitter current of transistor 26 and thus reinforces the positive going voltage at the collector electrode and, therefore, constitutes a feedback which is necessary to sustain oscillations of the resonant circuit 14.

In the operation of the oscillator, when any portion of the substantially sinusoidally varying voltate on the second tap terminal 46 exceeds the emitter electrode voltage plus the feedback diode forward voltage drop (shown as area 64 in FIG. 2), the feedback diode will be forward biased for a portion of the cycle of the signal. This forward biasing of the feedback diode 48 results in a direct charging current in the charge-storage capacitor 22 such that a negative voltage is produced on the transmission line inductor 20 with respect to the shielding enclosure.

With the negative voltage on the transmission line inductor 20, the total reverse bias on the feedback diode 48 is increased. When reverse biased, the feedback diode exhibits a capacitance which decreases with increased reverse bias. Therefore, less feedback current is provided to the emitter of transistor 26 when this capacitance decreases, which results in a decrease in the amplitude of the signal at the collector electrode. The negative voltage developed by the diode 48 thus provides for a relatively constant signal level at the second tap terminal 46.

With a relatively constant signal level at the second tap terminal 46, there is a relatively constant signal level across voltage-dependent capacitor 16 at any frequency to which the resonant circuit is tuned. Since the signal level across voltage-dependent capacitor 16 is maintained relatively constant, the tuning of the oscillator is only materially changed by changes of the tuning voltage supplied by potentiometer 50.

The resistor 56 provides a path for discharging the charge-storage capacitor 22 when the level of signal at the second tap terminal 46 drops below that required to forward bias diode 48. The aforementioned discharging provides for tracking of the charge on the charge-storage capacitor 22 for maintaining a relatively constant signal level at the second tap terminal 46.

What is claimed is:

1. An oscillator comprising:

a resonant circuit including at least an inductance element and a capacitance element;

an amplifying device having first, second and third electrodes;

biasing means coupled between said second and third electrodes for conditioning said amplifying device for conduction;

means for coupling said resonant circuit to said first electrode; and rectifier means coupling said resonant circuit to said third electrode of said amplifying device for sustaining oscillations in said resonant circuit, said rectifier means further providing charging of said capacitance element and reducing of the amplitude of oscillations fed back to said third electrode upon an increase of a first polarity portion of said oscillations beyond a predetermined level.

2. An oscillator as defined in claim 1 wherein said oscillator further includes a resistor coupled to said capacitance element to dissipate a portion of said charge.

3. An oscillator as defined in claim 1 wherein said means for coupling said resonant circuit to said first electrode comprises a capacitor.

4. An oscillator as defined in claim 1 and further comprising a source of potential and a source of reference potential wherein said biasing means comprises a first resistor and a second resistor connected in series combination between said source of potential and said reference potential, and having a common connection of said first and second resistors coupled to said second electrode of said amplifying device thereby establishing a relatively constant potential on said third electrode.

5. An oscillator as defined in claim 4 wherein said biasing means further comprises a bypass capacitor coupled between said second electrode of said amplifying device and said source of reference potential.

6. An oscillator as defined in claim 1 wherein said amplifying device is a transistor wherein said first electrode is a collector and said second electrode is a base and said third electrode is an emitter.

7. An oscillator as defined in claim 1 wherein said resonant circuit includes a voltage-dependent capacitor and means for coupling a tuning potential to said voltage-dependent capacitor.

8. An oscillator as defined in claim 1 and further comprising a pickup coil coupled to said inductance element for providing an output signal from said oscillator.

9. An oscillator comprising:

a resonant circuit comprising an inductance element, a capacitance element and a voltage-dependent capacitance;

a transistor having collector, base and emitter electrodes;

biasing means coupled between said base electrode and said emitter electrode to provide a relatively constant potential on said emitter electrode;

means for coupling said collector electrode to said resonant circuit;

a rectifier for coupling said resonant circuit to said emitter electrode of said transistor to sustain oscillations in said resonant circuit, said rectifier further providing charging of said capacitance element and reducing of the amplitude of oscillations fed back to said emitter electrode upon an increase of a first polarity portion of said oscillations beyond a predetermined level; and, a bleeder resistor coupled to said capacitance element to dissipate a portion of said charge.

10. An oscillator as defined in claim 9 and further comprising a source of potential and a source of reference potential wherein said biasing means comprises a first resistor and a second resistor connected in series combination between said source of potential and said source of reference potential and having a common connection of said first and second resistors coupled to said base of said transistor.

11. An oscillator as defined in claim 10 wherein said biasing means further comprises a bypass capacitor coupled between said base electrode of said transistor and said source of reference potential.

12. An oscillator as defined in claim 11 and further comprising an oscillator signal output coil coupled to said inductance element for providing an output signal from said oscillator.

* * * * *